US 7,969,182 B2

(12) United States Patent
Kim et al.

(10) Patent No.: US 7,969,182 B2
(45) Date of Patent: Jun. 28, 2011

(54) SEMICONDUCTOR DEVICES HAVING ZQ CALIBRATION CIRCUITS AND CALIBRATION METHODS THEREOF

(75) Inventors: Jun-bae Kim, Seoul (KR); Yang-ki Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/656,587

(22) Filed: Feb. 4, 2010

(65) Prior Publication Data

US 2011/0025373 A1    Feb. 3, 2011

(30) Foreign Application Priority Data

Aug. 3, 2009 (KR) .................. 10-2009-0071302

(51) Int. Cl.
*H03K 19/003* (2006.01)
(52) U.S. Cl. ........................ 326/30; 326/86; 327/108
(58) Field of Classification Search .............. 326/30, 326/86, 21; 327/108, 112
See application file for complete search history.

(56) References Cited

U.S. PATENT DOCUMENTS

| | | | | |
|---|---|---|---|---|
| 6,570,402 B2* | 5/2003 | Koo et al. | | 326/30 |
| 6,714,465 B2* | 3/2004 | Jang | | 365/194 |
| 6,812,732 B1* | 11/2004 | Bui | | 326/30 |
| 7,782,079 B2* | 8/2010 | Park | | 326/30 |

FOREIGN PATENT DOCUMENTS

| | | |
|---|---|---|
| JP | 2006-203405 | 8/2006 |
| KR | 10-2004-0083814 | 10/2004 |
| KR | 10-2007-0044790 | 4/2007 |
| KR | 10-0853466 | 8/2008 |

* cited by examiner

*Primary Examiner* — Vibol Tan
(74) *Attorney, Agent, or Firm* — Harness, Dickey & Pierce, P.L.C.

(57) ABSTRACT

Provided is a semiconductor device for performing a calibration operation without an external ZQ calibration command and a calibration method thereof. The semiconductor device includes a calibration circuit for performing a pull-down calibration operation in response to a pull-down calibration enable signal and a command control unit for generating the pull-down calibration enable signal in response to a DLL reset signal. The calibration method includes adjusting an impedance of a first pull-up resistance structure in response to pull-up calibration codes having a default value. A pull-down calibration enable signal may be generated in response to a DLL reset signal. A voltage of the first node and a reference voltage are compared by a comparator. The comparator outputs pull-down calibration codes based on the comparison. An impedance of a pull-down resistance structure is adjusted, so a resistance of the pull-down resistance structure is equal to a resistance of the first pull-up resistance structure.

17 Claims, 9 Drawing Sheets

SEMICONDUCTOR DEVICES HAVING ZQ CALIBRATION CIRCUITS AND CALIBRATION METHODS THEREOF

CROSS-REFERENCE TO RELATED APPLICATIONS

This nonprovisional U.S. application claims priority under 35 U.S.C. §119 to Korean Patent Application No. 10-2009-0071302, filed on Aug. 3, 2009, in the Korean Intellectual Property Office, the entire contents of which are incorporated herein by reference.

BACKGROUND

Inventive concepts relate to semiconductor devices and more particularly, to semiconductor devices for automatically performing a calibration operation without an external zero-quotient (ZQ) calibration command and calibration methods thereof.

In general, various semiconductor devices formed of central processing units (CPUs), memories, and integrated circuits (ICs), such as gate arrays, are used for numerous digital apparatuses such as personal computers (PCs), servers, work stations, or the like. Mostly, the semiconductor devices include an input circuit for receiving signals from an external circuit via an input pad, and an output circuit for providing internal signals to the external circuit.

Meanwhile, due to an increase of operating speed of the digital apparatuses, a swing width of each of the signals that are interfaced between the semiconductor devices is reduced. The reduction of the swing width minimizes the transmission time of the signals. However, as the swing width is reduced, the semiconductor devices are affected by external noise, and signal reflection caused by an impedance mismatch is a serious problem in an interface.

The impedance mismatch occurs due to external noise, a change in a power voltage, variations in temperature, or a change in a semiconductor manufacture process. When the impedance mismatch occurs, it is difficult to rapidly transmit data, and output data from an output terminal of a semiconductor device can be distorted. Thus, a semiconductor device of an input apparatus may receive a distorted output signal. The distorted output signal often causes problems such as a set-up/hold failure, miss-calculation, or the like. In order to solve these problems, a semiconductor device, which is rapidly operated, uses an impedance mismatching circuit adjacent to a pad in an IC chip.

In general, for impedance mismatching between a transmitter and a receiver, a source termination is performed by an output circuit in the transmitter, and a parallel termination is performed by a termination circuit that is connected in parallel with an input circuit connected to an input pad in the receiver.

A process for providing pull-up and pull-down codes to terminations based on a process, voltage, and temperature (PVT) variation is related to ZQ calibration. A termination resistor of a data input/output pad (DQ pad) is controlled by using codes that are generated as a result of the ZQ calibration.

For example, the semiconductor device includes a ZQ pin as a terminal for the ZQ calibration, and thus receives ZQ calibration commands ZQCS (ZQ calibration short) and ZQCL (ZQ calibration long) from an external source. When the external ZQ calibration commands ZQCS and ZQCL are received, the ZQ calibration is performed in a period that is defined by the external ZQ calibration commands ZQCS and ZQCL. Since it is not possible to use the output circuit during the ZQ calibration, an access to the IC chip is prevented, and a next command is not input. The period defined by the external ZQ calibration commands ZQCS and ZQCL indicates a period for the ZQ calibration, and thus, the ZQ calibration needs to be completed within the predetermined period. The ZQ calibration is performed by matching the codes with an externally-mounted termination resistor.

Meanwhile, once the ZQ calibration is complete, an output impedance of the semiconductor device may be changed according to a circumstance in which the semiconductor device is disposed, e.g., an operation mode, a power voltage, a temperature, or the like.

SUMMARY

According to an aspect of inventive concepts, there is provided a semiconductor device including a calibration circuit for performing a pull-down calibration operation in response to a pull-down calibration enable signal and a command control unit for generating the pull-down calibration enable signal in response to a DLL reset signal.

The calibration circuit may include a pin not being connected to an external termination resistor, a first pull-up resistance structure being connected to a first node and adjusting an impedance of the first pull-up resistance structure in response to pull-up calibration codes having a default value, a first comparing unit comparing and determining a voltage of the first node and a reference voltage in response to the pull-down calibration enable signal, and outputting the pull-down calibration codes, and a pull-down resistance structure being connected to the first node, adjusting an impedance of the pull-down resistance structure in response to the pull-down calibration codes, and thus having a resistance value equal to a resistance value of the first pull-up resistance structure.

The calibration circuit may further include a second comparing unit comparing and determining a voltage of the pin and the reference voltage, and thus generating the pull-up calibration codes, and a second pull-up resistance structure being connected to the pin, and adjusting an impedance of the second pull-up resistance structure in response to the pull-up calibration codes. If an external termination resistor is connected to the pin, the pull-up calibration codes having the default value may be determined to allow a resistance value of the second pull-up resistance structure to be equal to a resistance value of the external termination resistor.

The command control unit may include an inverter for inputting the DLL reset signal, a latch unit for repeatedly inputting an output signal from the inverter and a calibration duration signal, and thus generating a calibration enable signal, a NAND gate for inputting a clock signal and the calibration enable signal, a flip-flop unit for inputting an output signal from the NAND gate and the calibration enable signal, and thus generating the calibration duration signal, a first buffer unit for inputting the calibration enable signal and a pull-up calibration off signal for indicating that the external termination resistor is not connected to the pin, and thus generating a pull-up calibration enable signal, and a second buffer unit for inputting the calibration enable signal, and thus generating the pull-down calibration enable signal.

According to another aspect of inventive concepts, there is provided a semiconductor device including a calibration circuit for performing a pull-up calibration operation and a pull-down calibration operation respectively in response to a pull-up calibration enable signal and a pull-down calibration enable signal and a command control unit for generating the pull-up calibration enable signal and the pull-down calibration enable signal in response to a DLL reset signal.

The calibration circuit may include a pin, an internal resistance structure embedded in the semiconductor device and a switch connecting the pin and the internal resistance structure, in response to an internal resistance structure enable signal indicating that the internal resistance structure is embedded in the semiconductor device.

The calibration circuit may further include a first comparing unit comparing and determining a voltage of the pin and a reference voltage in response to the pull-up calibration enable signal, and outputting pull-up calibration codes, a first pull-up resistance structure being connected to the pin and having a resistance value equal to a resistance value of the internal resistance structure, in response to the pull-up calibration codes, a second pull-up resistance structure being connected to a first node and adjusting an impedance of the second pull-up resistance structure, in response to the pull-up calibration codes, a second comparing unit comparing and determining a voltage of the first node and the reference voltage, in response to the pull-down calibration enable signal, and thus outputting the pull-down calibration codes, and a pull-down resistance structure being connected to the first node, adjusting an impedance of the pull-down resistance structure in response to the pull-down calibration codes, and thus having a resistance value equal to a resistance value of the second pull-up resistance structure.

The resistance value of the internal resistance structure may be adjusted by a fuse trimming method.

According to another aspect of inventive concepts, there is provided a calibration method of a pin which is not connected to an external termination resistor, the calibration method including the operations of being connected to a first node and adjusting an impedance of a first pull-up resistance structure in response to pull-up calibration codes having a default value, generating a pull-down calibration enable signal in response to a DLL reset signal, comparing and determining a voltage of the first node and a reference voltage in response to the pull-down calibration enable signal, and outputting pull-down calibration codes; and being connected to the first node and adjusting an impedance of a pull-down resistance structure in response to the pull-down calibration codes so as to have a resistance value equal to a resistance value of the first pull-up resistance structure.

According to another aspect of inventive concepts, there is provided a calibration method of a ZQ pin which is connected to an internal resistance structure embedded in a semiconductor device, the calibration method including the operations of connecting the ZQ pin and the internal resistance structure, in response to an internal resistance structure enable signal indicating that the internal resistance structure is embedded in the semiconductor device, generating a pull-up calibration enable signal and a pull-down calibration enable signal in response to a DLL reset signal, comparing and determining a voltage of the ZQ pin and a reference voltage in response to the pull-up calibration enable signal, and thus generating pull-up calibration codes, adjusting an impedance of a pull-up resistance structure connected to the pin, in response to the pull-up calibration codes, so as to have a resistance value equal to a resistance value of the internal resistance structure, adjusting an impedance of a second pull-up resistance structure connected to a first node, in response to the pull-up calibration codes, comparing and determining a voltage of the first node and a reference voltage in response to the pull-down calibration enable signal, and outputting the pull-down calibration codes, and adjusting an impedance of a pull-down resistance structure connected to the first node, in response to the pull-down calibration codes, so as to have a resistance value equal to a resistance value of the second pull-up resistance structure.

At least another example embodiment discloses a semiconductor device including a calibration circuit configured to perform a pull-down calibration operation based on a pull-down calibration enable signal and a command control unit configured to output the pull-down calibration enable signal based on a delay-locked loop (DLL) reset signal.

At least another example embodiment provides a calibration method for a semiconductor device having a calibration circuit. The method includes generating, by a command control unit, a pull-down calibration enable signal in based on a delay-locked loop (DLL) reset signal, receiving, by the calibration circuit, the pull-down calibration enable signal, and adjusting, by the calibration circuit, an impedance of a pull-down resistance structure of the calibration circuit based on the pull-down calibration enable signal. A resistance of the pull-down resistance structure is equal to a resistance of a first pull-up resistance structure after the adjusting.

According to at least one example embodiment a calibration method of a semiconductor device having a calibration circuit includes generating a pull-up calibration enable signal and a pull-down calibration enable signal based on a delay-locked loop (DLL) reset signal, generating pull-up calibration data based on the pull-up calibration enable signal, adjusting an impedance of a first pull-up resistance structure based on the pull-up calibration data, generating pull-down calibration data based on the pull-down calibration enable signal and the pull-up calibration data, and adjusting an impedance of a pull-down resistance structure based on the pull-down calibration codes. A resistance of the pull-down resistance structure is equal to a resistance of the first pull-up resistance structure after the adjusting.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
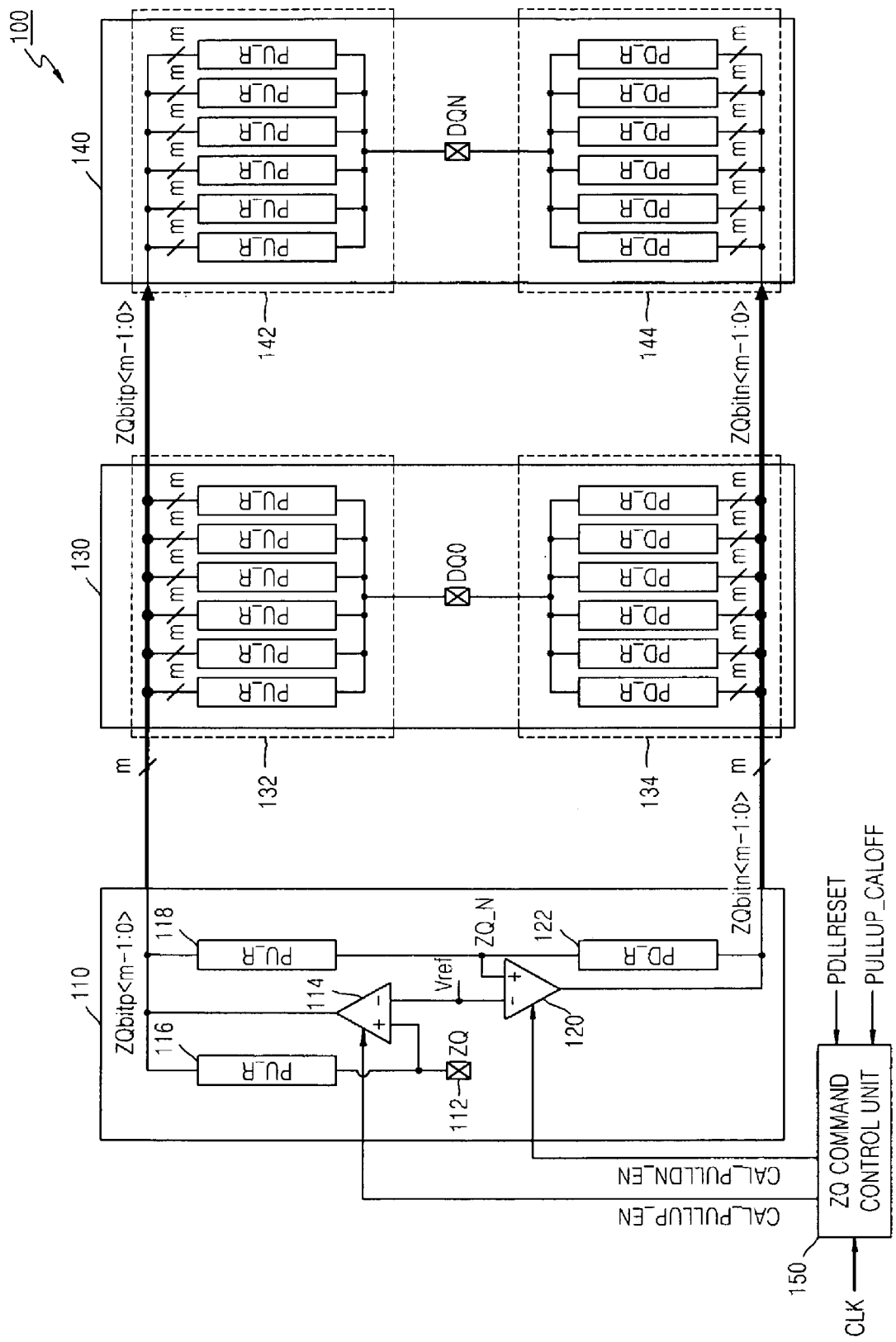
FIG. 1 is a diagram of a semiconductor device according to an example embodiment of inventive concepts.

Example embodiments of inventive concepts will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises", "comprising", "includes", and/or "including" if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram of a semiconductor device 100 according to an example embodiment of inventive concepts. Referring to FIG. 1, the semiconductor device 100 includes a ZQ calibration circuit 110, a plurality of on-die termination devices 130 and 140, and a ZQ command control unit 150.

Example embodiments provide a ZQ calibration that can be automatically performed without receiving a ZQ calibration command from an external source and adjust output impedance more precisely. In addition, if the ZQ calibration can be performed without the externally mounted termination resistor, that is, if the ZQ calibration can be performed by using an internally mounted termination resistance structure, the ZQ calibration is possible during a wafer test of the semiconductor device.

The ZQ calibration circuit 110 performs a pull-up calibration operation and a pull-down calibration operation in response to a pull-up calibration enable signal CAL_PULLUP_EN and a pull-down calibration enable signal CAL_PULLDN_EN, respectively. The ZQ calibration circuit 110 includes a ZQ pin 112, a first comparing unit 114, a first pull-up resistance structure (PU_R) 116, a second pull-up resistance structure 118, a second comparing unit 120, and a pull-down resistance structure (PD_R) 122.

The first comparing unit 114 compares and determines a voltage of the ZQ pin 112 and a reference voltage Vref, in response to the pull-up calibration enable signal CAL_PULLUP_EN, and outputs pull-up calibration codes ZQbitp<m−1:0> (pull-up calibration data). The reference voltage Vref may have a voltage level corresponding to a half of a power voltage. For example, the reference voltage Vref may be generated by a reference voltage generating circuit (not shown) for outputting the reference voltage Vref from a connection point of two resistors that are connected in series between the power voltage and a ground voltage.

Figure 2:
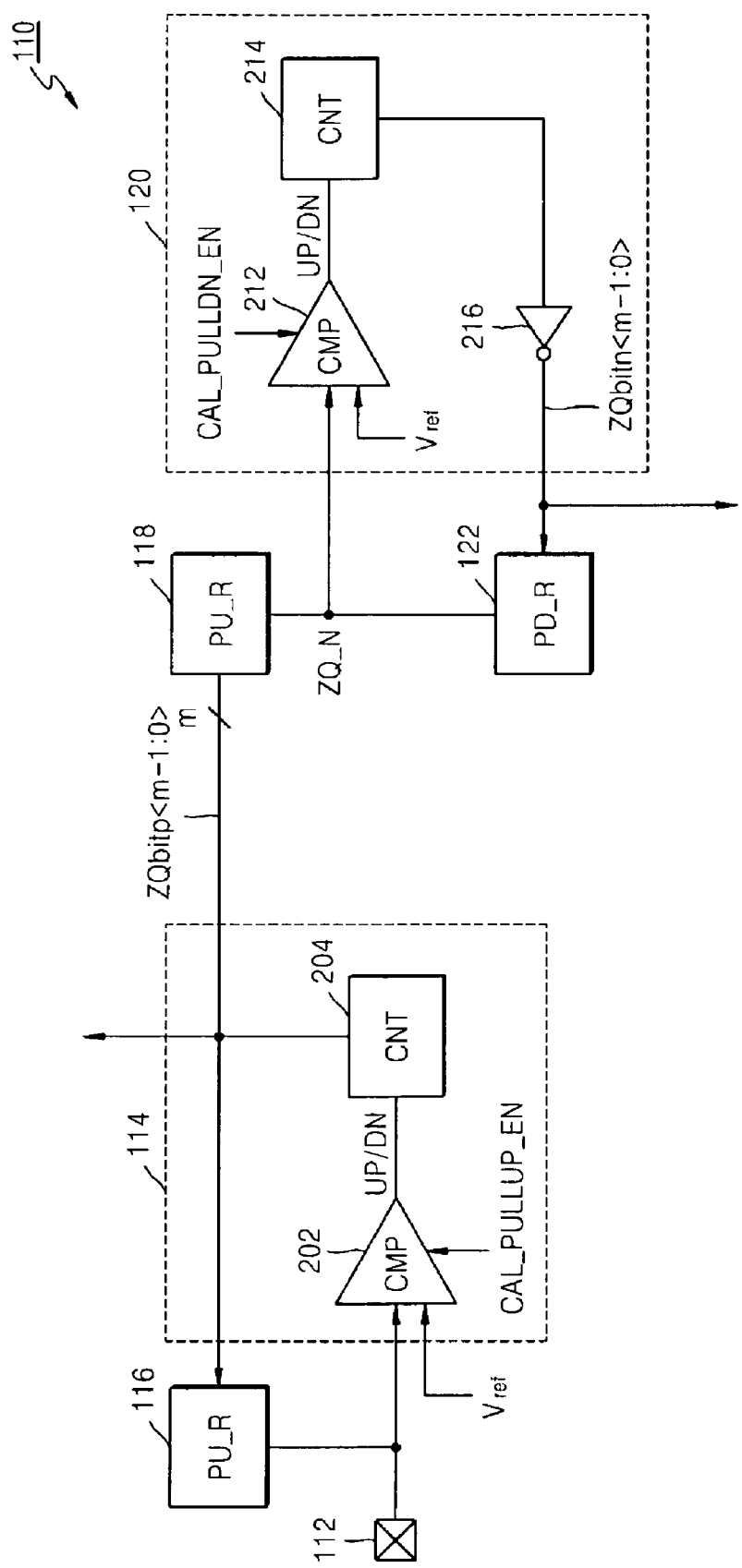
FIG. 2 is a diagram of a ZQ calibration circuit of the semiconductor device in FIG. 1 according to an example embodiment of inventive concepts.

FIG. 2 is a diagram of the ZQ calibration circuit 110 of the semiconductor device 100 in FIG. 1. As illustrated in FIG. 2, the first comparing unit 114 is formed of a comparator 202 and a counter 204, wherein the comparator 202 compares the voltage of the ZQ pin 112 and the reference voltage Vref, in response to the pull-up calibration enable signal CAL_PULLUP_EN and outputs an up/down (UP/DN) signal. The counter 204 performs a counting operation according to the UP/DN signal, and thus generates the pull-up calibration codes ZQbitp<m−1:0>.

Figure 3A:
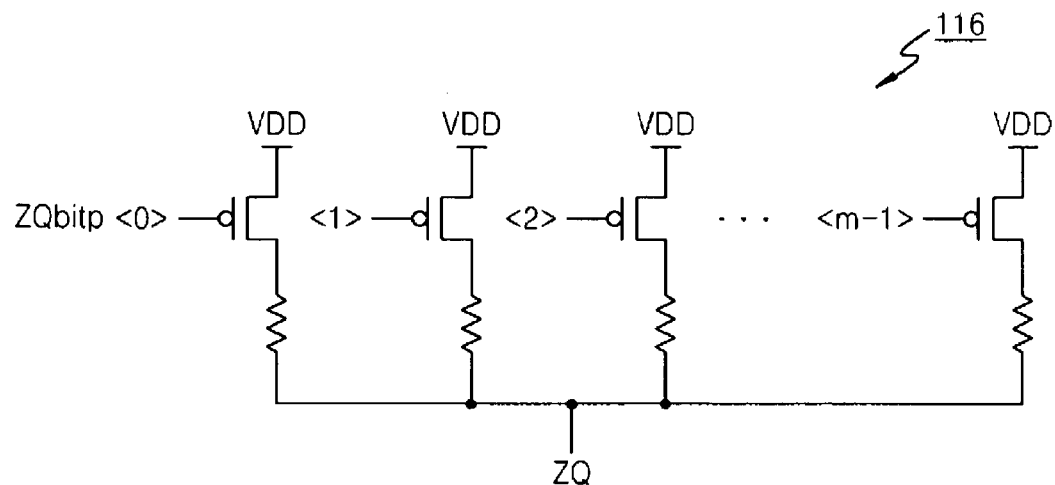
FIG. 3A is a diagram of a first pull-up resistance structure of the semiconductor device in FIG. 1 according to an example embodiment of inventive concepts.

The first pull-up resistance structure 116 is connected to the ZQ pin 112. As illustrated in FIG. 3A, the first pull-up resistance structure 116 is formed of p-type metal-oxide-semiconductor field-effect (PMOS) transistors and resistors between a power voltage VDD and the ZQ pin 112. The PMOS transistors input the pull-up calibration codes ZQbitp<m−1:0> to the gates of the PMOS transistors, respectively, and the resistors are connected in series with the PMOS transistors. The first pull-up resistance structure 116 adjusts its own impedance in response to the pull-up calibration codes ZQbitp<m−1:0>. The first comparing unit 114 and the first pull-up resistance structure 116 repeatedly perform comparing and determining operations until the voltage of the ZQ pin 112 and the reference voltage Vref are equal to each other, and then generate the pull-up calibration codes ZQbitp<m−

1:0>. This repetitive operation for generating the pull-up calibration codes ZQbitp<m−1:0> indicates a pull-up calibration operation.

Figure 3B:
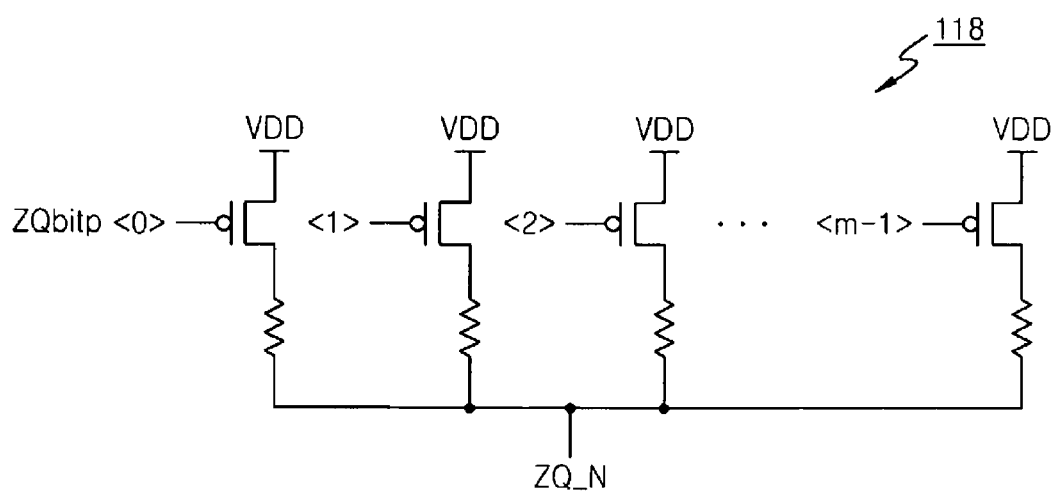
FIG. 3B is a diagram of a second pull-up resistance structure of the semiconductor device in FIG. 1 according to an example embodiment of inventive concepts.

FIG. 3B illustrates that second pull-up resistance structure 118. The second pull-up resistance structure functions in the same manner as the first pull-up resistance structure 116 and therefore, for the sake of clarity and brevity, will not be described in greater detail.

Referring to FIG. 1, the second pull-up resistance structure 118 is connected to a first node ZQ_N, and adjusts its own impedance in response to the pull-up calibration codes ZQbitp<m−1:0>. The second pull-up resistance structure 118 is formed in the same manner as the first pull-up resistance structure 116 in FIG. 2, and includes PMOS transistors and resistors between the power voltage VDD and the first node ZQ_N. The PMOS transistors input the pull-up calibration codes ZQbitp<m−1:0> to the gates of the PMOS transistors, respectively, and the resistors are connected in series with the PMOS transistors. The second pull-up resistance structure 118 has the same resistance value as that of the first pull-up resistance structure 116.

The second comparing unit 120 compares and determines a voltage of the first node ZQ_N and the reference voltage Vref, in response to the pull-down calibration enable signal CAL_PULLDN_EN, and outputs pull-down calibration codes ZQbitn<m−1:0> (pull-down calibration data).

As illustrated in FIG. 2, the second comparing unit 120 is formed of a comparator 212, a counter 214, and an inverter 216, wherein the comparator 212 compares the voltage of the first node ZQ_N and the reference voltage Vref, in response to the pull-down calibration enable signal CAL_PULLDN_EN, and outputs an up/down (UP/DN) signal. The counter 214 performs a counting operation according to the UP/DN signal. The inverter 216 receives an output from the counter 214 and thus generates the pull-down calibration codes ZQbitn<m−1:0>.

Figure 4:
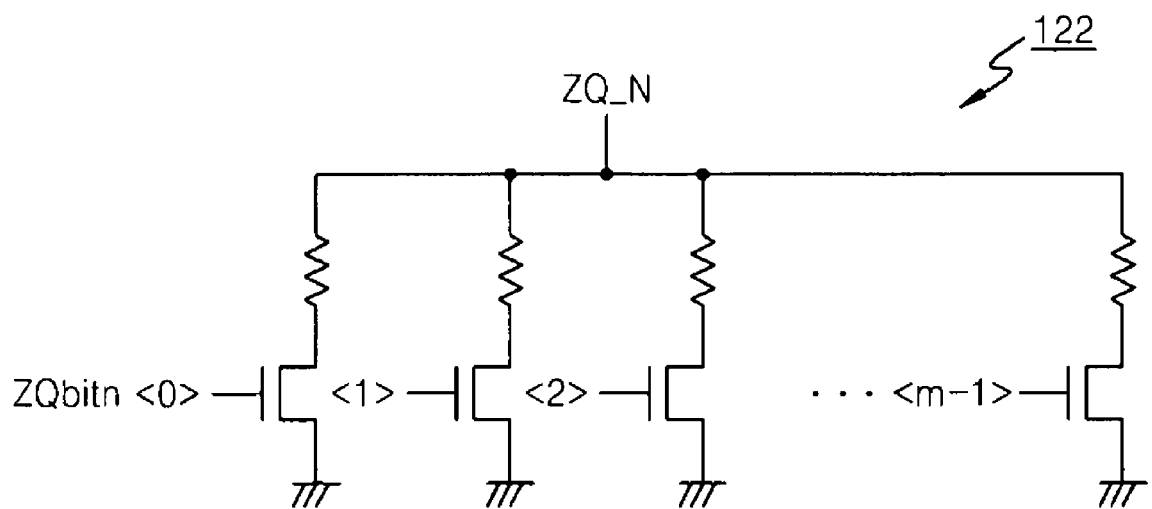
FIG. 4 is a diagram of a pull-down resistance structure of the semiconductor device in FIG. 1 according to an example embodiment of inventive concepts.

The pull-down resistance structure 122 is connected to the first node ZQ_N, and adjusts its own impedance in response to the pull-down calibration codes ZQbitn<m−1:0>. As illustrated in FIG. 4, the pull-down resistance structure 122 is formed of n-type metal-oxide-semiconductor field-effect (NMOS) transistors and resistors between the first node ZQ_N and a ground voltage VSS. The NMOS transistors input the pull-down calibration codes ZQbitn<m−1:0> to the gates of the NMOS transistors, respectively, and the resistors are connected in series with the NMOS transistors.

The second comparing unit 120 and the pull-down resistance structure 122 repeatedly compare the voltage of the first node ZQ_N and the reference voltage Vref so as to allow the pull-down resistance structure 122 to have the same resistance value as that of the second pull-up resistance structure 118, and thus generate the pull-down calibration codes ZQbitn<m−1:0>. This repetitive operation for generating the pull-down calibration codes ZQbitn<m−1:0> indicates a pull-down calibration operation.

Referring to FIG. 1, the pull-up calibration codes ZQbitp<m−1:0> and the pull-down calibration codes ZQbitn<m−1:0>, which are respectively generated by the pull-up calibration operation and the pull-down calibration operation, determine resistance value of the on-die termination devices 130 and 140 of data input/output pads DQ0-DQn. The on-die termination devices 130 and 140 of the data input/output pads DQ0-DQn include pull-up resistance structures 134 and 142, and pull-down resistance structures 132 and 144. The pull-up resistance structures 132 and 142 are adjusted to have the same resistance value as those of the first and second pull-up resistance structures 116 and 118 in the ZQ calibration circuit 110, in response to the pull-up calibration codes ZQbitp<m−1:0>. The pull-down resistance structures 134 and 144 are adjusted to have the same resistance value as that of the pull-down resistance structure 122 in the ZQ calibration circuit 110, in response to the pull-down calibration codes ZQbitn<m−1:0>.

Figure 5:
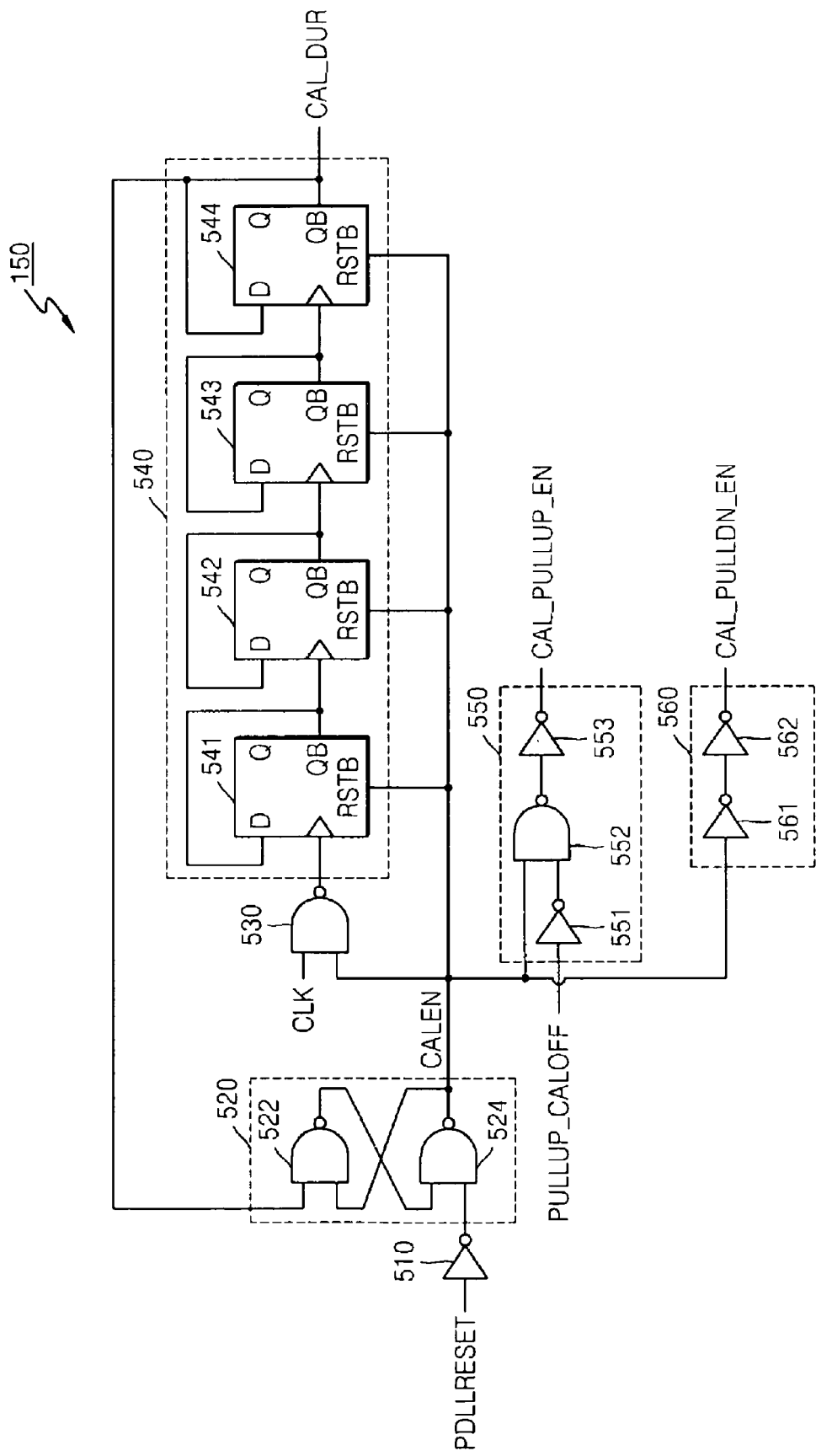
FIG. 5 is a diagram of a ZQ command control unit of the semiconductor device in FIG. 1 according to an example embodiment of inventive concepts.

The ZQ command control unit 150 generates the pull-up calibration enable signal CAL_PULLUP_EN and the pull-down calibration enable signal CAL_PULLDN_EN, in response to a clock signal CLK, a delay-locked loop (DLL) reset signal PDLLRESET, and a pull-up calibration off signal PULLUP_CALOFF. FIG. 5 is a diagram of the ZQ command control unit 150 of the semiconductor device 100 in FIG. 1 according to an example embodiment. As illustrated in FIG. 5, the ZQ command control unit 150 includes an inverter 510, a latch unit 520, a NAND gate 530, a flip-flop unit 540, a first buffer unit 550, and a second buffer unit 560. The inverter 510 receives the DLL reset signal PDLLRESET, the latch unit 520 receives an inverted signal of the DLL reset signal PDLLRESET and a calibration duration signal CAL_DUR and generates a calibration enable signal CALEN. The NAND gate 530 receives the clock signal CLK and the calibration enable signal CALEN. The flip-flop unit 540 receives an output from the NAND gate 530 and the calibration enable signal CALEN and generates the calibration duration signal CAL_DUR. The first buffer unit 550 receives the calibration enable signal CALEN and the pull-up calibration off signal PULLUP_CALOFF and generates the pull-up calibration enable signal CAL_PULLUP_EN. The second buffer unit 560 receives the calibration enable signal CALEN and generates the pull-down calibration enable signal CAL_PULLDN_EN.

The latch unit 520 includes a first NAND gate 522 for receiving the calibration duration signal CAL_DUR and the calibration enable signal CALEN, and a second NAND gate 524 for outputting the calibration enable signal CALEN by receiving an output from the first NAND gate 522 and an output from the inverter 510.

The flip-flop unit 540 is formed of first through fourth flip-flops 541, 542, 543, and 544 to which the calibration enable signal CALEN is input as a reset signal RESETB for the flip-flops 541-544. The output from the NAND gate 530 is input to the first flip-flop 541 as a clock signal, and an output signal QB of the first flip-flop 541 is input to the first flip-flop 541 as a data signal D. The output signal QB from the first flip-flop 541 is also input to the second flip-flop 542 as a clock signal, and an output signal QB for the second flip-flop 542 is input to the second flip-flop 542 as a data signal D for the second flip-flop 542. The output signal QB from the second flip-flop 542 is also input to the third flip-flop 543 as a clock signal, and an output signal QB of the third flip-flop 543 is input to the third flip-flop 543 as a data signal D for the third flip-flop 543. The output signal QB from the third flip-flop 543 is also input to the fourth flip-flop 544 as a clock signal, an output signal QB for the fourth flip-flop 544 is the input to the fourth flip-flop 544 as a data signal D and output as the calibration duration signal CAL_DUR. In order to provide a time sufficient to perform the pull-up and pull-down calibration operations described in relation to FIG. 1, the flip-flop unit 540 generates the calibration duration signal CAL_DUR. According to the present example embodiment, the flip-flop unit 540 includes the four flip-flops 541, 542, 543, and 544, however, the number of flip-flops included in the flip-flop unit 540 is not limited thereto and thus may vary.

The first buffer unit 550 includes a first inverter 551 for receiving the pull-up calibration off signal PULLUP_CALOFF, a NAND gate 552 for receiving an output from the first inverter 551 and the calibration enable signal CALEN, and a second inverter 553 for receiving an output from the NAND gate 552 and outputting the pull-up calibration enable signal CAL_PULLUP_EN. The pull-up calibration off signal PULLUP_CALOFF indicates that an externally mounted termination resistor is not connected to the ZQ pin 112 in the ZQ calibration circuit 110. The pull-up calibration off signal PULLUP_CALOFF may be provided by a user who recognizes that the externally mounted termination resistor is not connected to the ZQ pin 112 and thus uses a fuse cutting method or a mode register setting method. However, it should be understood that the pull-up calibration off signal PULLUP_CALOFF may be provided by other ways. The second buffer unit 560 includes a first inverter 561 for receiving the calibration enable signal CALEN, and a second inverter 562 for receiving an output from the first inverter 561 and outputting the pull-down calibration enable signal CAL_PULLDN_EN.

Figure 6:
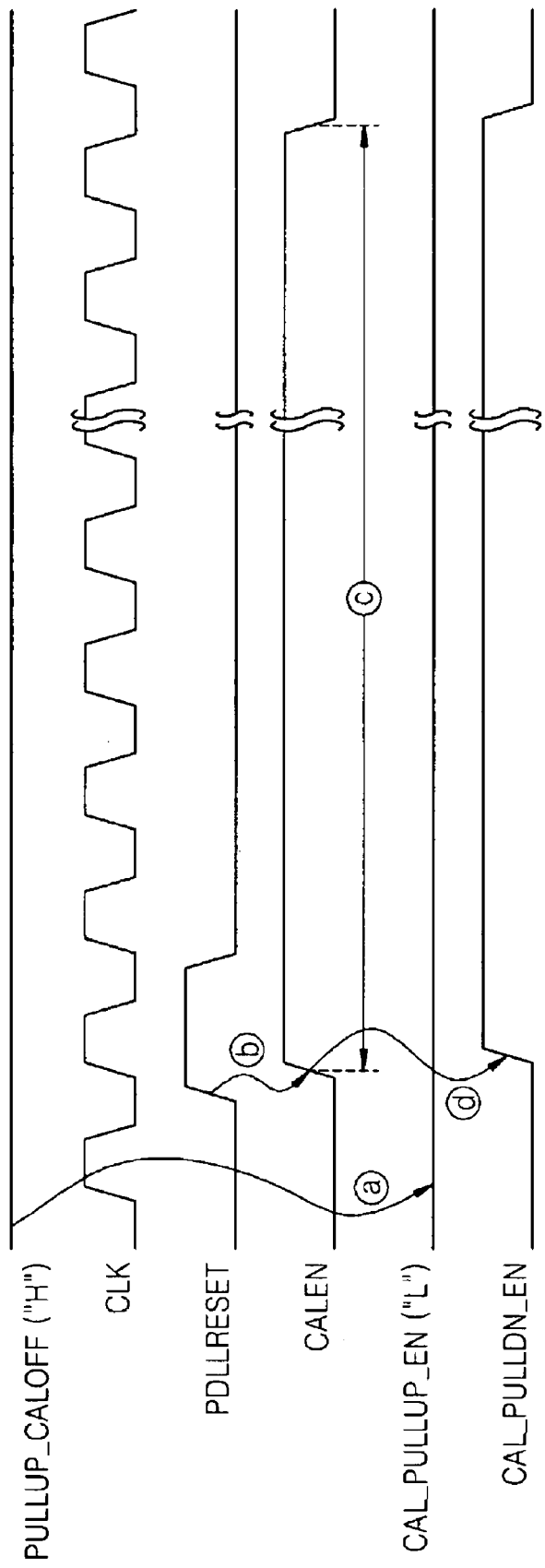
FIG. 6 is a timing diagram for describing an example operation of the ZQ command control unit in FIG. 5.

Referring to the ZQ calibration circuit 110 in FIG. 1, the externally mounted termination resistor is not connected to the ZQ pin 112. Accordingly, the pull-up calibration off signal PULLUP_CALOFF is provided as a signal at logic high level "H". An example operation of the ZQ command control unit 150 in FIG. 5 is described with reference to a timing diagram of FIG. 6. FIG. 6 is the timing diagram for describing the operation of the ZQ command control unit 150 in FIG. 5. Referring to FIGS. 5 and 6, the pull-up calibration enable signal CAL_PULLUP_EN is deactivated to logic low level "L" in response to the pull-up calibration off signal PULLUP_ CALOFF at logic high level "H" (ⓐ). The deactivated pull-up calibration enable signal CAL_PULLUP_EN disables the first comparing unit 114 in the ZQ calibration circuit 110 in FIG. 1, and thus the pull-up calibration operation is not performed.

In response to the logic high level "H" of the DLL reset signal PDLLRESET for indicating a DLL lock cycle, the calibration enable signal CALEN is activated to logic high level "H" (ⓑ). The DLL lock cycle is provided by when a power of the semiconductor device 100 is on, or by a specification after a self-refresh is complete. The activated calibration enable signal CALEN is maintained at logic high level "H" during a time sufficient for the flip-flop unit 540 to perform the pull-down calibration operation (ⓒ). When the calibration enable signal CALEN becomes activated, the pull-down calibration enable signal CAL_PULLDN_EN is activated to logic high level "H" (ⓓ). The activated pull-down calibration enable signal CAL_PULLDN_EN enables the second comparing unit 120 in the ZQ calibration circuit 110 in FIG. 1, and thus the pull-down calibration operation is performed.

Here, the resistance value of the second pull-up resistance structure 118 in the ZQ calibration circuit 110 is determined by the pull-up calibration codes ZQbitp<m−1:0> that are set as a default value. According to the present example embodiment, the externally mounted termination resistor is not connected to the ZQ pin 112 in the ZQ calibration circuit 110 in FIG. 1. If an external termination resistor of 240Ω is connected to the ZQ pin 112, the pull-up calibration codes ZQbitp<m−1:0> of the default value indicate values that allow the resistance value of the first pull-up resistance structure 116 to be equal to 240Ω.

The second comparing unit 120 in the ZQ calibration circuit 110 performs the pull-down calibration operation and thus generates the pull-down calibration codes ZQbitn<m−1: 0> in response to the pull-down calibration enable signal CAL_PULLDN_EN so as to allow the pull-down resistance structure 122 to have the same resistance value as that of the second pull-up resistance structure 118.

According to the present example embodiment, when the externally mounted termination resistor is not connected to the ZQ pin 112 in the ZQ calibration circuit 110, only the pull-down calibration operation is performed so that a whole calibration operation time may be reduced. Also, according to the present example embodiment, a calibration operation is automatically performed by using the DLL reset signal PDLLRESET that indicates the DLL lock cycle, without an external ZQ calibration command.

Figure 7:
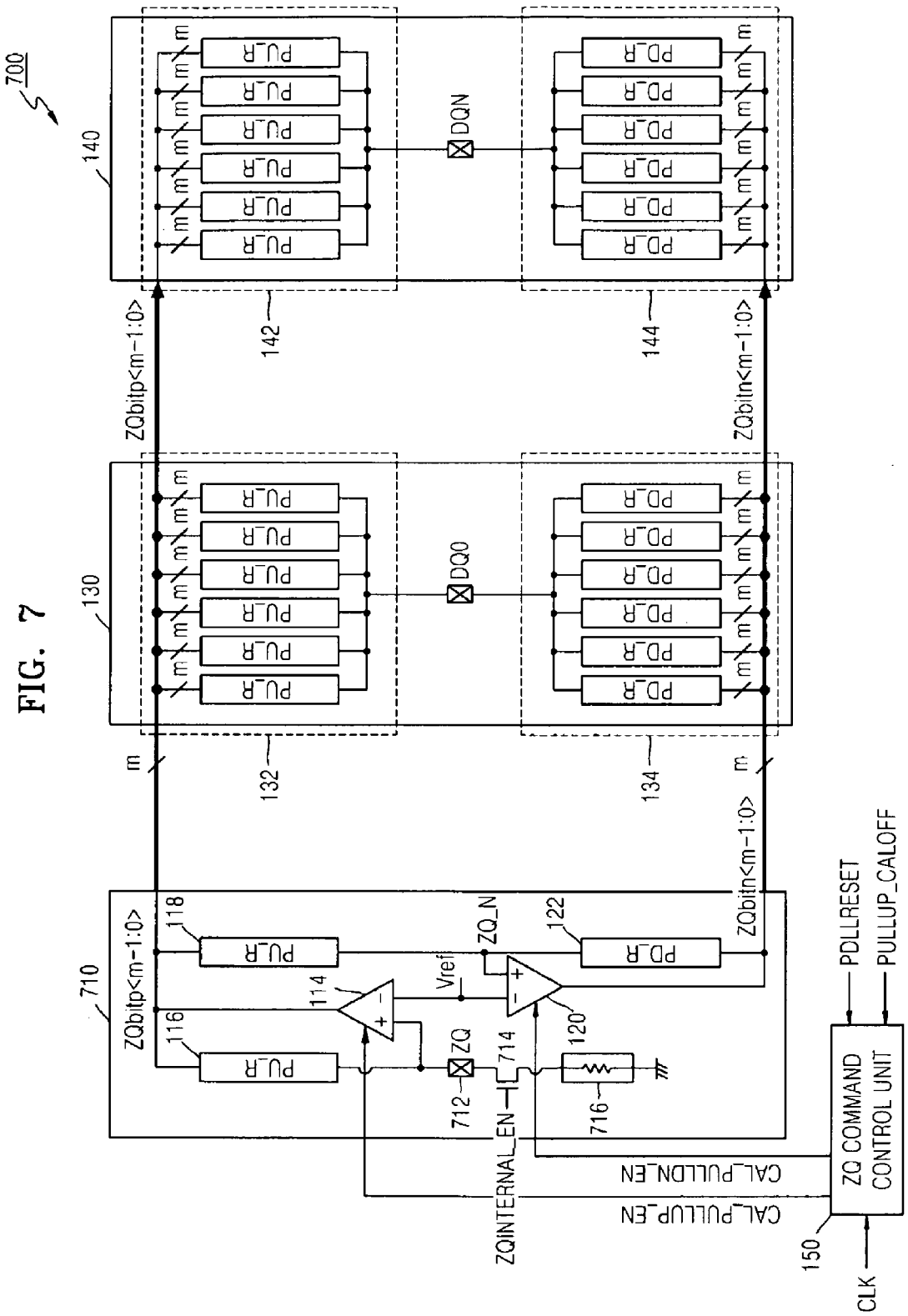
FIG. 7 is a diagram of a semiconductor device according to another example embodiment of the inventive concepts.

FIG. 7 is a diagram of a semiconductor device 700 according to another example embodiment of inventive concepts. Compared with the semiconductor device 100 in FIG. 1, the semiconductor device 700 in FIG. 7 has the same plurality of on-die termination devices 130 and 140 and the same ZQ command control unit 150 but has a different ZQ calibration circuit 710. Thus, detailed descriptions of the on-die termination devices 130 and 140 and the ZQ command control unit 150 are not provided here.

The ZQ calibration circuit 710 includes a switch 714 that is operatively connected to a ZQ pin 712 and an internal resistance structure 716. The switch 714 connects the internal resistance structure 716 and the ZQ pin 712, in response to an internal resistance structure enable signal ZQINTERNAL_EN. The internal resistance structure 716 has an externally mounted termination resistor, e.g., a resistance value of 240Ω, and may be embedded in the semiconductor device 700. The internal resistance structure enable signal ZQINTERNAL_EN indicates that the semiconductor device 700 includes the internal resistance structure 716. The internal resistance structure enable signal ZQINTERNAL_EN may be provided by a user who recognizes that the semiconductor device 700 includes the internal resistance structure 716 and thus uses a fuse cutting method or a mode register setting method. However, it should be understood that the internal resistance structure enable signal ZQINTERNAL_EN may be provided by other ways.

Figure 8:
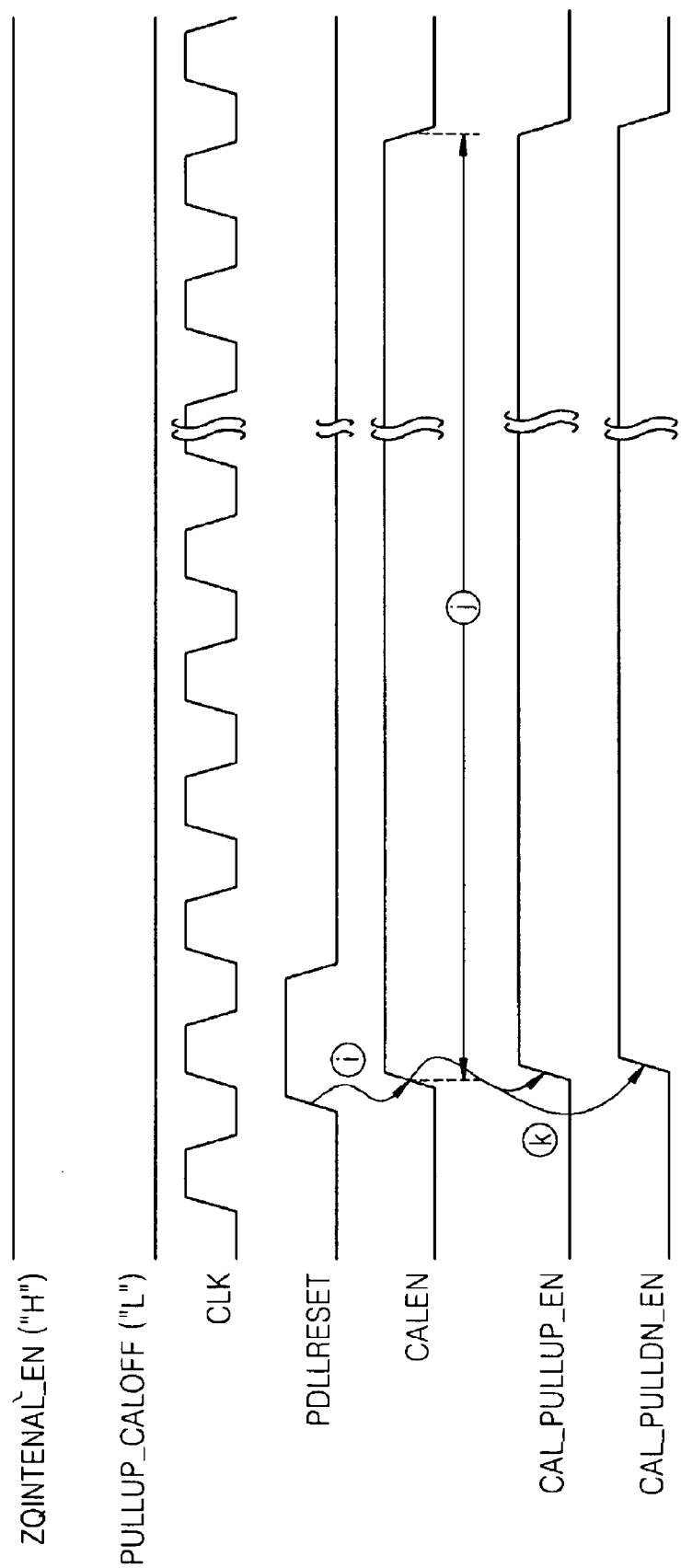
FIG. 8 is a timing diagram for describing an example operation of the ZQ command control unit in FIG. 5 in the semiconductor device in FIG. 7.

The ZQ calibration circuit 710 performs the pull-up calibration operation and the pull-down calibration operation in response to the pull-up calibration enable signal CAL_PULLUP_EN and the pull-down calibration enable signal CAL_PULLDN_EN, respectively, which are generated by the ZQ command control unit 150 in FIG. 5. The ZQ command control unit 150 in FIG. 5 is described with reference to a timing diagram of FIG. 8, and controls the ZQ calibration circuit 710. FIG. 8 is a timing diagram for describing an example operation of the ZQ command control unit 150 used in the semiconductor device in FIG. 7. Referring to FIGS. 5 and 8, the internal resistance structure enable signal ZQINTERNAL_EN is activated at logic high level "H", and the pull-up calibration off signal PULLUP_CALOFF is provided as a signal at logic low level "L" (pull-up calibration on signal). The pull-up calibration enable signal CAL_PULLUP_EN is initially at logic low level "L".

In response to the logic high level "H" of the DLL reset signal PDLLRESET, the calibration enable signal CALEN is activated to logic high level "H" (ⓘ). The activated calibration enable signal CALEN is maintained during a time sufficient for the flip-flop unit 540 to perform the pull-down calibration operation (ⓙ).

When the activated calibration enable signal CALEN is activated, the pull-up calibration enable signal CAL_PULLUP_EN and the pull-down calibration enable signal CAL_PULLDN_EN are activated to logic high level "H" (ⓚ).

Since the activated pull-up calibration enable signal CAL_PULLUP_EN enables a first comparing unit 114 in the ZQ calibration circuit 710 in FIG. 7, the pull-up calibration operation is performed to allow a first pull-up resistance structure 116 to have the same resistance value as that of the internal resistance structure 716, and thus pull-up calibration codes ZQbitp<m−1:0> are generated. According to the pull-up calibration codes ZQbitp<m−1:0>, a resistance value of a second pull-up resistance structure 118 is determined. Since the activated pull-down calibration enable signal CAL_PULLDN_EN enables a second comparing unit 120 in the ZQ calibration circuit 710 in FIG. 7, the pull-down calibration operation is performed to allow a pull-down resistance structure 122 to have the same resistance value as that of the second pull-up resistance structure 118, and thus the pull-down calibration codes ZQbitn<m−1:0> are generated.

According to the present example embodiment, when the internal resistance structure 716 is connected to the ZQ pin 712 in the ZQ calibration circuit 710, the pull-up and pull-down calibration operations are performed so that it is possible to more precisely perform a calibration operation. Also, according to the present example embodiment, the calibration operation is automatically performed by using the DLL reset signal PDLLRESET that indicates the DLL lock cycle, without an external ZQ calibration command.

Figure 9:
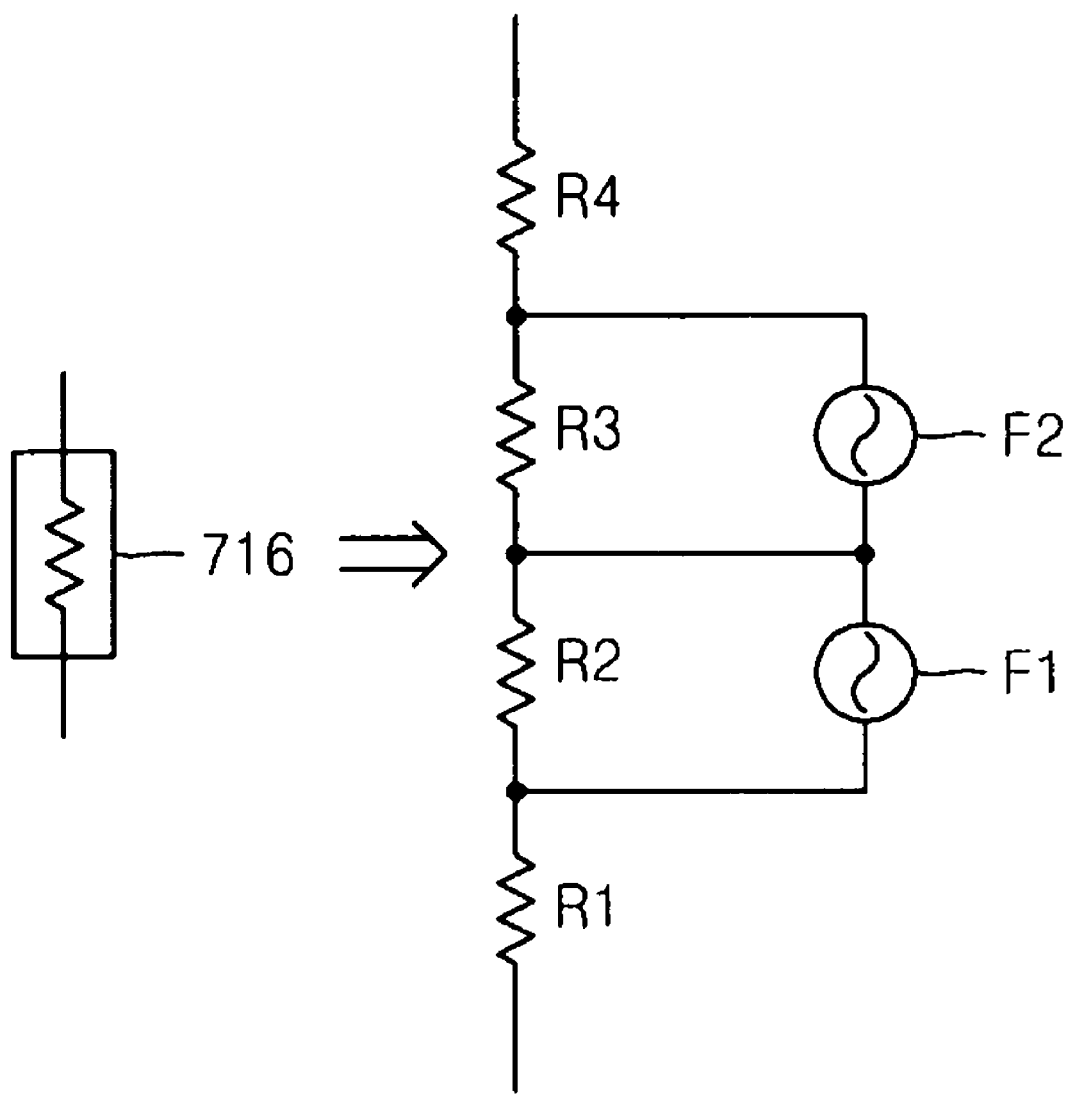
FIG. 9 is a diagram of an internal resistance structure embedded in the semiconductor device in FIG. 7 according to an example embodiment of inventive concepts.

Since the internal resistance structure 716 is embedded in the semiconductor device 700 in FIG. 7, a resistance value of the internal resistance structure 716 may be distorted due to a manufacturing process error. In order to compensate for the distortion of the resistance value of the internal resistance structure 716, the internal resistance structure 716 may include a plurality of resistors R1-R4 that are connected in series, and fuses F1-F2, as shown in FIG. 9. By selectively shorting the fuse that is connected to both end terminals of the resistor, the resistance value of the internal resistance structure 716 is adjusted to compensate for the distorted resistance value of the internal resistance structure 716.

While inventive concepts have been particularly shown and described with reference to example embodiments thereof, it will be understood that various changes in form and details may be made therein without departing from the spirit and scope of the following claims.

What is claimed is:

1. A semiconductor device comprising:
   a calibration circuit configured to perform a pull-down calibration operation based on a pull-down calibration enable signal, the calibration circuit including,
      a first pull-up resistance structure connected to a first node, the first pull-up resistance structure configured to adjust an impedance of the first pull-up resistance structure based on pull-up calibration data having a first value,
      a first comparing unit configured to compare a voltage of the first node and a reference voltage, and output pull-down calibration data based on the pull-down calibration enable signal and the comparison of the voltage of the first node and the reference voltage, and
      a pull-down resistance structure connected to the first node, the pull-down resistance structure configured to adjust an impedance of the pull-down resistance structure based on the pull-down calibration data; and
   a command control unit configured to output the pull-down calibration enable signal based on a delay-locked loop (DLL) reset signal.

2. The semiconductor device of claim 1, wherein a resistance of the pull-down resistance structure is equal to a resistance of the first pull-up resistance structure.

3. The semiconductor device of claim 1, wherein the calibration circuit further includes,
   a pin;
   a second comparing unit configured to compare a voltage of the pin and the reference voltage and output the pull-up calibration data based on the comparison of the voltage of the pin and the reference voltage; and
   a second pull-up resistance structure being connected to the pin, the second pull-up resistance structure being configured to adjust an impedance of the second pull-up resistance structure based on the pull-up calibration data.

4. The semiconductor device of claim 3, wherein the calibration circuit further includes,
   an external termination resistor connected to the pin, wherein
      the second pull-up resistance structure is configured to adjust a resistance value of the second pull-up resistance structure to equal a resistance of the external termination resistor if the pull-up calibration data is the first value.

5. The semiconductor device of claim 4, wherein the command control unit includes,
   an inverter configured to invert the DLL reset signal and output a signal based on the received DLL reset signal;
   a latch unit configured to receive the output signal from the inverter and a calibration duration signal and output a calibration enable signal based on the received output signal from the inverter and calibration duration signal;
   a NAND gate configured to receive a clock signal and the calibration enable signal and output a signal based on the received clock signal and calibration enable signal;
   a flip-flop unit configured to receive an output signal from the NAND gate and the calibration enable signal and output the calibration duration signal based on the received output signal from the NAND gate and calibration enable signal;
   a first buffer unit configured to receive the calibration enable signal and output the pull-up calibration enable signal based on the received calibration enable signal; and
   a second buffer unit configured to receive the calibration enable signal and output the pull-down calibration enable signal based on the received calibration enable signal.

6. A semiconductor device comprising:
   a calibration circuit configured to perform a pull-down calibration operation based on a pull-down calibration enable signal; and
   a command control unit configured to output the pull-down calibration enable signal based on a delay-locked loop (DLL) reset signal, the command control unit including,
      an inverter configured to invert the DLL reset signal and output a signal based on the received DLL reset signal,
      a latch unit configured to receive the output signal from the inverter and a calibration duration signal and output a calibration enable signal based on the received output signal from the inverter and calibration duration signal,
      a NAND gate configured to receive a clock signal and the calibration enable signal and output a signal based on the received clock signal and calibration enable signal,
      a flip-flop unit configured to receive an output signal from the NAND gate and the calibration enable signal and output the calibration duration signal based on the received output signal from the NAND gate and calibration enable signal,
a first buffer unit configured to receive the calibration enable signal and a pull-up calibration off signal and output the pull-up calibration enable signal based on the received calibration enable signal, and
a second buffer unit configured to receive the calibration enable signal and output the pull-down calibration enable signal based on the received calibration enable signal.

7. A semiconductor device comprising:
a calibration circuit configured to perform a pull-down calibration operation based on a pull-down calibration enable signal, the calibration circuit configured to perform a pull-up calibration operation based on a pull-up calibration enable signal, and the calibration circuit including,
a pin,
an internal resistance structure, and
a switch configured to operatively connect the pin and the internal resistance structure based on an internal resistance structure enable signal indicating that the internal resistance structure is embedded in the semiconductor device; and
a command control unit configured to output the pull-down calibration enable signal based on a delay-locked loop (DLL) reset, the command control unit configured to output the pull-up calibration enable signal based on the DLL reset signal.

8. The semiconductor device of claim 7, wherein the calibration circuit further includes,
a first comparing unit configured to compare a voltage of the pin and a reference voltage and output pull-up calibration data based on the comparison of the voltage of the pin and the reference voltage and the pull-up calibration enable signal;
a first pull-up resistance structure being connected to the pin, the first pull-up resistance structure configured to adjust a resistance of the first pull-up resistance structure to equal a resistance of the internal resistance structure based on the pull-up calibration data;
a second pull-up resistance structure being connected to a first node, the second pull-up resistance structure configured to adjust an impedance of the second pull-up resistance structure being based on the pull-up calibration data;
a second comparing unit configured to compare a voltage of the first node and the reference voltage and output the pull-down calibration data based on the pull-down calibration enable signal and the comparison of the voltage of the first node and the reference voltage; and
a pull-down resistance structure being connected to the first node, the pull-down resistance structure being configured to adjust an impedance of the pull-down resistance structure based on the pull-down calibration data.

9. The semiconductor device of claim 8, wherein the pull-down resistance structure has a resistance equal to a resistance of the second pull-up resistance structure.

10. The semiconductor device of claim 7, wherein the command control unit includes,
an inverter configured to invert the DLL reset signal and output a signal based on the received DLL reset signal;
a latch unit configured to receive the output signal from the inverter and a calibration duration signal and output a calibration enable signal based on the received output signal from the inverter and calibration duration signal;
a NAND gate configured to receive a clock signal and the calibration enable signal and output a signal based on the received clock signal and the calibration enable signal;
a flip-flop unit configured to receive the output signal from the NAND gate and the calibration enable signal and output the calibration duration signal based on the received output signal from the NAND gate and calibration enable signal;
a first buffer unit configured to receive the calibration enable signal and a pull-up calibration on signal indicating that the internal resistance structure is connected to the pin, and output a pull-up calibration enable signal based on the received calibration enable signal and pull-up calibration on signal; and
a second buffer unit configured to receive the calibration enable signal and output the pull-down calibration enable signal based on the received calibration enable signal.

11. The semiconductor device of claim 7, wherein the internal resistance structure is configured to adjust a resistance of the internal resistance structure.

12. The semiconductor device of claim 11, wherein the internal resistance structure includes a plurality of resistors connected in series and a fuse connected to end terminals of at least one of the plurality of resistors, and the internal resistance structure is configured to short the fuse to adjust the resistance of the internal resistance structure.

13. A calibration method for a semiconductor device, the method comprising:
generating, by a command control unit, a pull-down calibration enable signal based on a delay-locked loop (DLL) reset signal;
receiving, by a calibration circuit, the pull-down calibration enable signal; and
adjusting, by a pull-down resistance structure, an impedance of the pull-down resistance structure of the calibration circuit based on the pull-down calibration enable signal, a resistance of the pull-down resistance structure being equal to a resistance of a first pull-up resistance structure after the adjusting, the adjusting including,
adjusting the impedance of the pull-down resistance structure based on pull-up calibration data generated by the calibration circuit.

14. The method of claim 13, further comprising:
generating, by the calibration circuit, a calibration enable signal, wherein the adjusting includes,
adjusting the impedance of the pull-down resistance structure based on the calibration enable signal.

15. A calibration method of a semiconductor device, the calibration method comprising:
generating, by a command control unit, a pull-up calibration enable signal and a pull-down calibration enable signal based on a delay-locked loop (DLL) reset signal;
generating, by a calibration circuit, pull-up calibration data based on the pull-up calibration enable signal;
adjusting, by a first pull-up resistance structure, an impedance of the first pull-up resistance structure based on the pull-up calibration data;
generating, by the calibration circuit, pull-down calibration data based on the pull-down calibration enable signal and the pull-up calibration data; and
adjusting, by a pull-down resistance structure, an impedance of the pull-down resistance structure based on the pull-down calibration codes, a resistance of the pull-down resistance structure being equal to a resistance of the first pull-up resistance structure after the adjusting.

16. The method of claim 15, further comprising:

connecting, by a switch, a pin and an internal resistance structure, the pin being connected to a second pull-up resistance structure that is connected to the first pull-up resistance structure; and adjusting, by a second pull-up resistance structure, an impedance of the second pull-up resistance structure based on the pull-up calibration data, a resistance of the second pull-up resistance structure being equal to a resistance of the internal resistance structure.

17. The calibration method of claim 15, further comprising:

trimming, by the internal resistance structure, a fuse of the internal resistance structure to adjust a resistance of the internal resistance structure.

* * * * *